US009405604B2

(12) United States Patent
Bhargava

(10) Patent No.: US 9,405,604 B2
(45) Date of Patent: Aug. 2, 2016

(54) METHOD AND APPARATUS FOR CONNECTING DEBUG INTERFACE TO PROCESSING CIRCUITS WITHOUT SIDEBAND INTERFACE

(71) Applicant: Apple Inc., Cupertino, CA (US)

(72) Inventor: Nitin Bhargava, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/253,150

(22) Filed: Apr. 15, 2014

(65) Prior Publication Data

US 2015/0293172 A1      Oct. 15, 2015

(51) Int. Cl.
*G06F 13/12*      (2006.01)
*G06F 9/45*       (2006.01)
*G06F 11/00*      (2006.01)
*G01R 31/317*     (2006.01)
*G06F 11/22*      (2006.01)

(52) U.S. Cl.
CPC .......... *G06F 11/00* (2013.01); *G01R 31/31705* (2013.01); *G06F 11/22* (2013.01)

(58) Field of Classification Search
CPC ................................ G06F 11/00; H04B 17/00
USPC ........................................................... 710/65
See application file for complete search history.

(56) References Cited

U.S. PATENT DOCUMENTS

| 5,590,354 | A | * | 12/1996 | Klapproth et al. | 714/30 |
| 5,978,902 | A | * | 11/1999 | Mann | 712/227 |
| 6,584,590 | B1 | * | 6/2003 | Bean | 714/724 |
| 7,506,233 | B2 | | 3/2009 | Yamada | |
| 7,548,090 | B2 | * | 6/2009 | Redgrave | G06F 7/764 326/38 |
| 7,908,533 | B2 | * | 3/2011 | Somasundaram et al. | 714/727 |
| 8,055,946 | B2 | * | 11/2011 | Kang et al. | 714/30 |
| 8,639,981 | B2 | | 1/2014 | Chong | |
| 2011/0194425 | A1 | | 8/2011 | Li et al. | |
| 2013/0091396 | A1 | * | 4/2013 | Portolan | 714/744 |

FOREIGN PATENT DOCUMENTS

CN         102968364       3/2013

\* cited by examiner

*Primary Examiner* — Titus Wong
(74) *Attorney, Agent, or Firm* — Meyertons, Hood, Kivlin, Kowert & Goetzel, P.C.; Erik A. Heter

(57) ABSTRACT

An integrated circuit (IC) having a debug access port coupled to a processing circuit without a dedicated sideband interface is disclosed. In one embodiment, an IC includes a processor circuit and a DAP. The IC also includes a communications fabric over which communications transactions may be conveyed between the various functional circuits of the IC using a fabric protocol. Both the DAP and the processing circuit are coupled to the communications fabric. The IC also includes a translation circuit coupled between the processing circuit and the communications fabric. The translation circuit may translate transactions conveyed between the processing circuit and the DAP from or to a debug protocol to or from the fabric protocol. Thus, the DAP and the processing circuit may communicate according to the debug protocol without a dedicated sideband coupled therebetween.

20 Claims, 5 Drawing Sheets

US 9,405,604 B2

METHOD AND APPARATUS FOR CONNECTING DEBUG INTERFACE TO PROCESSING CIRCUITS WITHOUT SIDEBAND INTERFACE

BACKGROUND

1. Technical Field

This disclosure is directed to integrated circuits, and more particularly, to providing access to internal circuitry through a debug access port.

2. Description of the Related Art

Boundary scan testing was originally developed to test connections between integrated circuits (IC's) and printed circuit boards (PCB's) in the absence of other ways to probe them. Boundary scan is based on the Joint Test Action Group (JTAG) specification, which is also known at the Institute of Electrical and Electronic Engineers (IEEE) Standard 1149.1. In particular, the IEEE 1149.1 standard provided a mechanism for providing access to pins of an IC to determine the presence of proper connections.

Although the IEEE 1149.1 standard was originally developed for boundary scan, its uses have expanded to other areas. For example, JTAG ports are now used to obtain access to an IC for debugging during the development phase. For example, a JTAG controller may be used to access portions of an IC while conducting tests of system software in a new design.

SUMMARY

An integrated circuit (IC) having a debug access port coupled to a processing circuit without a dedicated sideband interface is disclosed. In one embodiment, an IC includes a processor circuit and a DAP. The IC also includes a communications fabric over which communications transactions may be conveyed between the various functional circuits of the IC using a fabric protocol. Both the DAP and the processing circuit are coupled to the communications fabric. The IC also includes a translation circuit coupled between the processing circuit and the communications fabric. The translation circuit may translate transactions conveyed between the processing circuit and the DAP from or to a debug protocol to or from the fabric protocol. Thus, the DAP and the processing circuit may communicate according to the debug protocol without a dedicated sideband coupled therebetween.

In one embodiment, a method includes conducting transactions between a DAP of an IC and a processing circuit of the IC, via a communications fabric. The transactions may be conveyed on the communications fabric in accordance with a fabric protocol. Transactions conveyed to the processing circuit may be received by a translation circuit and translated from the fabric protocol to a debug protocol before being forwarded processing circuit. Transactions conveyed from the processing circuit to the DAP may be received by the translation circuit in accordance with the debug protocol, and translated to the fabric protocol. After translation to the fabric protocol, the transaction may be conveyed to the DAP via the communications fabric.

BRIEF DESCRIPTION OF THE DRAWINGS

The following detailed description makes reference to the accompanying drawings, which are now briefly described.

Figure 1:
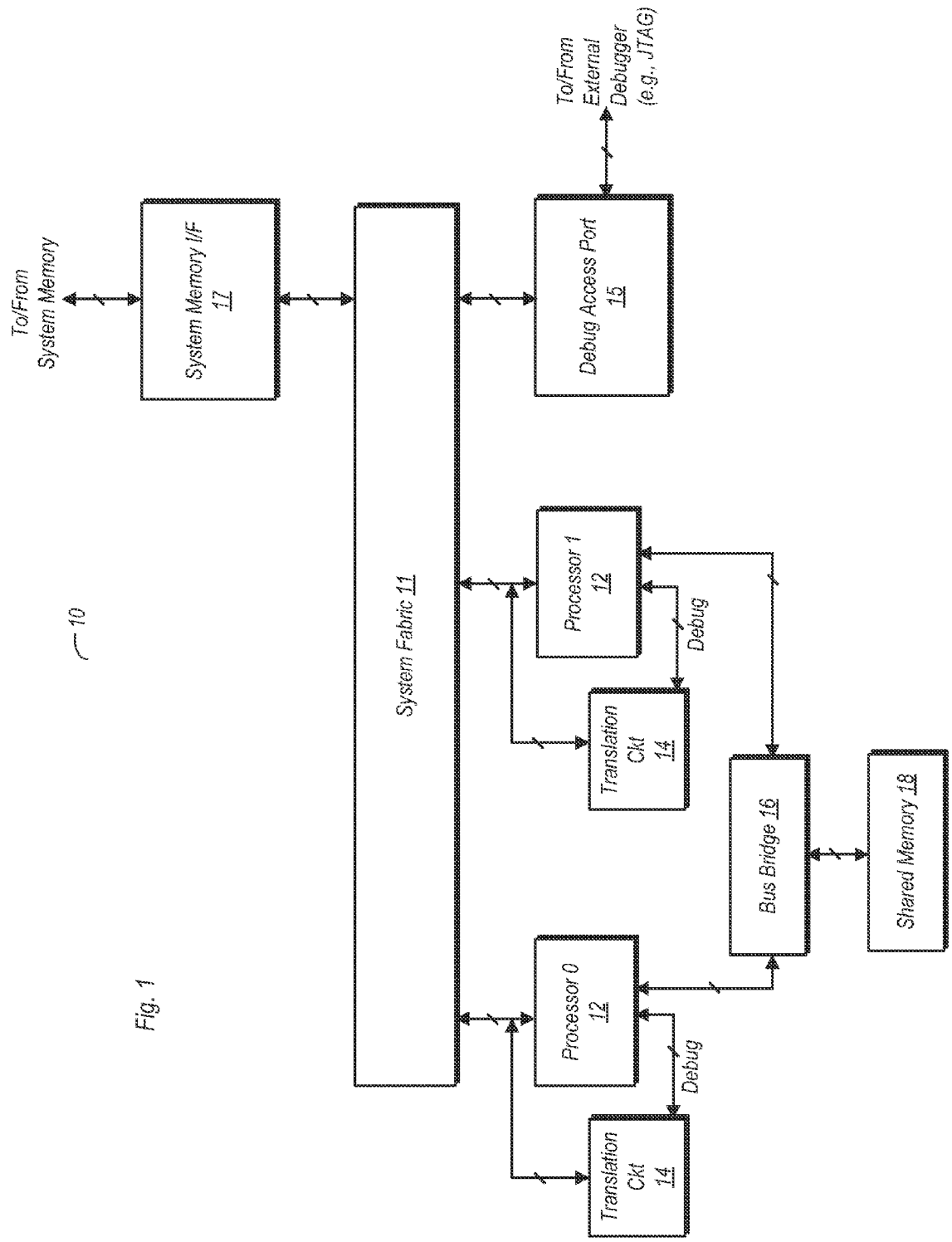
FIG. 1 is a block diagram of one embodiment of an IC.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION OF EMBODIMENTS

FIG. 1 is a block diagram of one embodiment of an IC. In the embodiment shown, IC 10 is a system on a chip (SoC) that includes two processors 12. IC 10 also includes a system fabric 11 (also referred to as a 'communications fabric') to facilitate communications between the processors 12 as well as with other functional units of the SoC, some of which are not shown here for the sake of simplicity. As defined herein, a communications fabric (or interconnect fabric) may be a network of switches and/or other units of circuitry on a chip, with physical links coupled therebetween. In various embodiments, the physical links coupled between any two units may comprise a dedicated communications path therebetween. An interconnect fabric may implement a network on a chip (NoC), and this network may in some embodiments be a packet-switched network. Packets of information may be conveyed between two different functional units (e.g., between the two processors), although the routing (i.e. the path traveled) of one packet between a given source and destination may be different than the routing of another packet between the same source and same destination.

IC 10 in the embodiment shown also includes a system memory interface 17, a debug access port (DAP) 15, a bus bridge 16, and a shared memory 18. The shared memory 18 in the embodiment shown is a memory shared by the two instances of processor 12, and is not used by other units in the system.

DAP 15 in the embodiment shown is configured for coupling to an external debugger. In one embodiment, DAP 15 may conform to the Joint Test Action Group (JTAG) protocol, although this disclosure is not limited to such an embodiment/protocol. Through DAP 15, the external debugger may obtain access to various functional circuit units within IC 10. Included in the units that are accessible by the external debugger via DAP 15 is each of the processors 12. Through DAP 15, various information may be input into processors 12 (e.g., test inputs) and various information may also be extracted therefrom (e.g., state information resulting from test inputs). In general, the external debugger to which DAP 15 may be used to debug the design of software configured to execute on processors 12, or in the debugging of the actual hardware design of a prototype of processors 12. Specific sub-units of each processor 12 (e.g., execution units) may also be targeted for access by the external debugger through DAP 15. DAP 15 and the external debugger may also be used for the same purposes with other units of IC 10 not explicitly discussed or shown herein.

Communications between DAP 15 and the processors 12 may be conducted using a debug protocol (e.g., the JTAG protocol). In prior art implementations, this may be conducted through a sideband bus which is a dedicated bus configured for conveying information between the processors 12 and DAP 15 using the debug protocol. However, the sideband buses may consume a non-negligible amount of area on a die of IC 10 due to the routing. Such routing may be inefficient since it is primarily used for debug purposes. However, IC 10 in the embodiment shown may be implemented without the sideband buses. Instead, IC 10 as shown herein is configured to enable communications between processors 12 and DAP 15 via the communications fabric using the same protocol (fabric protocol) used for normal, non-debug communications. This may in turn allow for more efficient use of die area by allowing the elimination of sideband buses, while also enabling the same debug communications to take place.

To facilitate the use of system fabric 11 for communications between DAP 15 and each of processors 12, corresponding translation circuits 14 may be implemented. In the embodiment shown, each processor 12 is associated with a corresponding dedicated instance of a translation circuit 14. Each translation circuit 14 is coupled between the system fabric 11 and its corresponding processor 12. Each translation circuit 14 may perform translations of information between the fabric protocol and the debug protocol. For example, information conveyed from DAP 15 may be translated from the fabric protocol to the debug protocol by a given translation circuit before being conveyed to its corresponding processor 12. Similarly, if a processor 12 is conveying information to DAP 15, it may send the information to its corresponding translation circuit 14, where it is translated into the fabric protocol and subsequently conveyed to DAP 15. It is noted that DAP 15 may also include similar translation circuitry for performing translations between the fabric protocol and the debug protocol.

As noted above, system fabric 11 in one embodiment may implement an on-chip packet switched network. When DAP 15 transmits packets intended for a given one of processors 12, it may address each packet for the corresponding translation circuit 14. The translation circuit 14, upon receiving the packet, may then perform the translation from fabric protocol to debug protocol. When conducting a transmission from a processor 12 to DAP 15, the corresponding translation circuit 14 may receive the transmission from the processor, in the debug protocol, and subsequently perform a translation to the fabric protocol. Thereafter, the packets may be conveyed over the system fabric 11 to DAP 15. Upon receiving the packets, DAP 15 may re-translate back into the debug protocol before performing further actions with the information contained therein.

For normal communications (i.e., non-debug related communications), each of processors 12 may transmit packets directly to and receive packets directly from systems fabric 11, without any intervention by translation circuit 14.

Shared memory 18 may be used by both of processors 12. Access to shared memory 18 by processors 12 may be controlled by bus bridge 16. Among the functions performed by bus bridge 16 may be arbitration between access requests from the processors 12 (which are also labeled here as processor 0 and processor 1). In one embodiment, the arbitration may be simplified by prioritizing processor 0 over processor 1. When processor 1 makes an access request, bus bridge 16 may determine if processor 0 also has a pending request for the same cycle. If processor 0 does not have a request, then processor 1 is granted accessed to shared memory 18. Otherwise, if processor 0 does have a pending request, access to shared memory 18 is granted thereto, with the request by processor 1 being serviced in a subsequent cycle.

Figure 2:
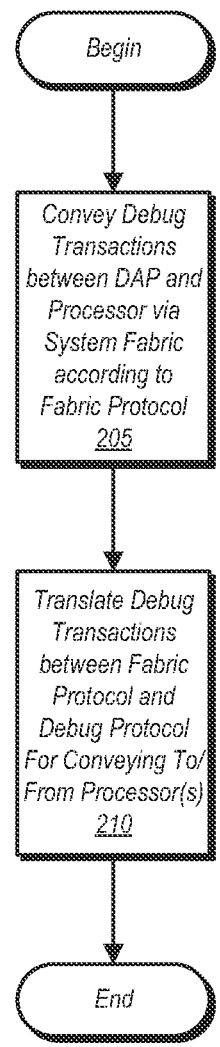
FIG. 2 is a flow diagram of one embodiment of a method for facilitating communications between a DAP and a processing circuit via a communications fabric.

FIG. 2 is a flow diagram of one embodiment of a method for facilitating communications between a DAP and a processing circuit via a communications fabric. Method 200 as shown in FIG. 2 and discussed herein may be performed on an embodiment of IC 10 as discussed above, or another IC not explicitly discussed herein. Furthermore, while transactions discussed herein are between a DAP and a processor, the disclosure is not so limited. On the contrary, the disclosure it intended to cover transactions between a DAP and any other internal circuitry that can be made accessible by a DAP.

Method 200 includes the conveying of debug transactions between a DAP and a processor via a system fabric according to a fabric protocol (block 205). For example, the fabric may be an on-chip packet-switched network, and thus debug transactions may be conveyed between the processor and the DAP as packets. However, it is noted that the system fabric is not limited by this disclosure to being a packet-switched network, and thus other fabric protocols are possible and contemplated.

Method 200 further includes translating debug transactions between the fabric protocol and a debug protocol (block 210). Transaction conveyed from a DAP to a processor be sent across the system fabric using the fabric protocol may be received and translated into the debug protocol by a translation circuit, and subsequently forwarded to the processor. Transactions conveyed from a processor may be received in the debug protocol, translated to the fabric protocol, and subsequently transmitted across the system fabric, in the fabric protocol, to the DAP.

Figure 3:
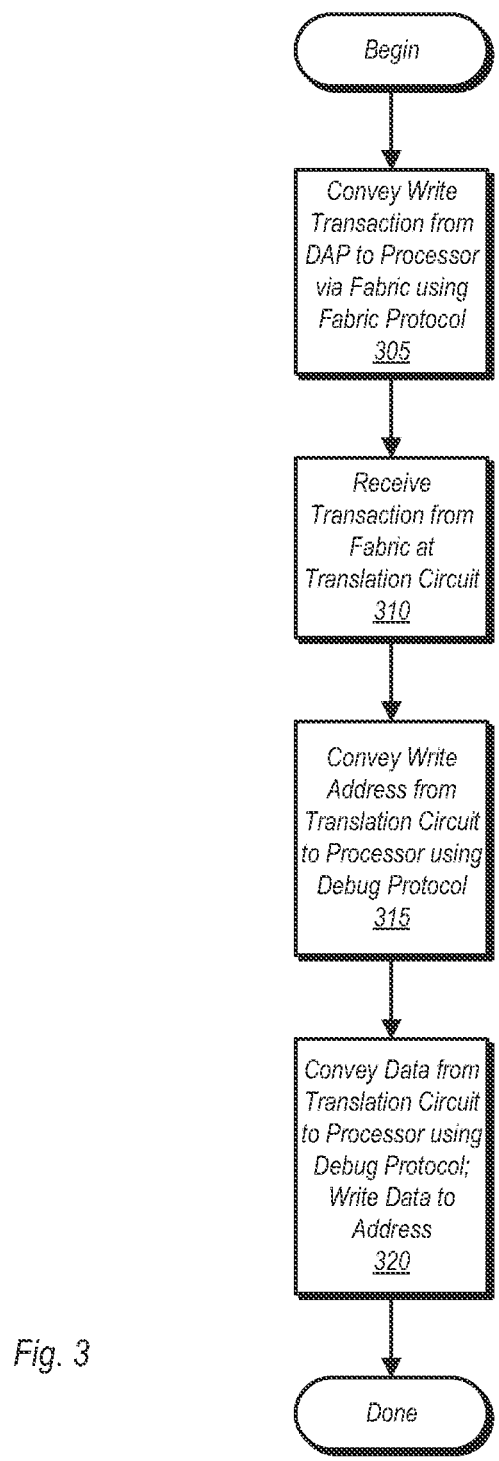
FIG. 3 is a flow diagram of one embodiment of a method for a DAP conducting a write to a processing circuit via a communications fabric.

FIG. 3 is a flow diagram of one embodiment of a method for a DAP conducting a write to a processing circuit via a communications fabric. Method 300 as shown in FIG. 3 and discussed herein may be performed on an embodiment of IC 10 as discussed above, or another IC not explicitly discussed herein. Furthermore, while transactions discussed herein are between a DAP and a processor, the disclosure is not so limited. On the contrary, the disclosure it intended to cover transactions between a DAP and any other internal circuitry that can be made accessible by a DAP.

Method 300 begins with the conveying a write transaction from the DAP to the processor via the fabric using the fabric protocol (block 305). The write transaction may be received from the fabric by a translation circuit (block 310). As noted above, in one embodiment the fabric may be an on-chip packet-switched network, with the packets of the transaction having the translation circuit as their destination. Upon receiving the write transaction, the translation circuit may translate the transaction from the fabric protocol to the debug protocol, and may further separate the transaction into multiple transactions. The translation circuit may then, on a first cycle subsequent to performing the translation, convey, using the debug protocol, the write address to the processor (block 315). On a second cycle subsequent to performing the translation, the translation circuit may convey the write data to the processor, using the debug protocol (block 320). The data may then be written to the address conveyed on the previous cycle.

Figure 4:
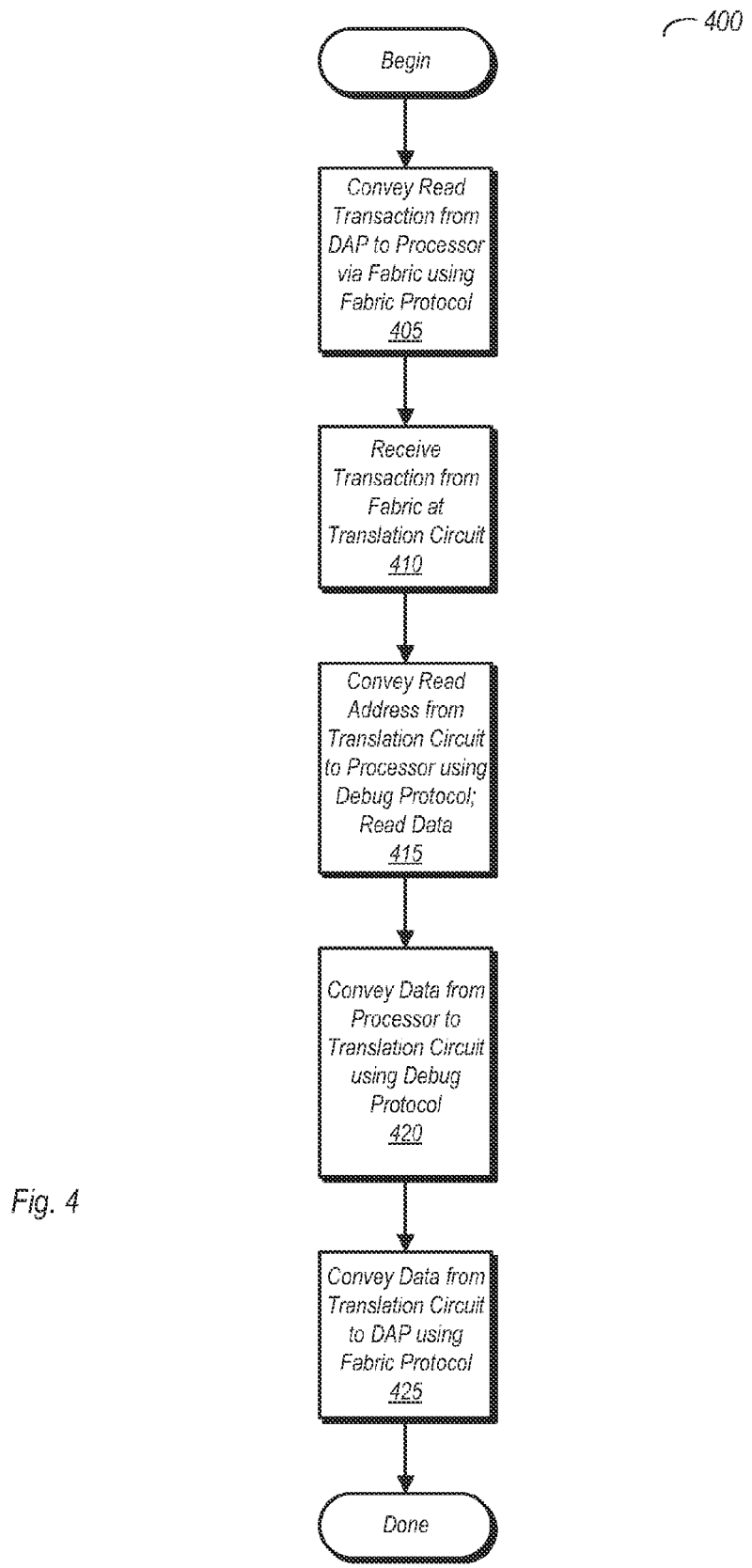
FIG. 4 is a flow diagram of one embodiment of a method for a DAP conducting a read with a processing circuit via a communications fabric.

FIG. 4 is a flow diagram of one embodiment of a method for a DAP conducting a read with a processing circuit via a communications fabric. As with the methods illustrated in FIGS. 2 and 3, method 400 as shown in FIG. 4 and discussed herein may be performed on an embodiment of IC 10 as discussed above, or another IC not explicitly discussed herein. Furthermore, while transactions discussed herein are between a DAP and a processor, the disclosure is intended to cover transaction between a DAP and any circuitry/unit accessible by a DAP.

Method 400 begins with the conveying of a read transaction/request from the DAP to a processor via a fabric and using the fabric protocol (block 405). The transaction may be received from the fabric by a translation circuit (block 410), where it may be translated from the fabric protocol to a debug protocol. Subsequent to translation, the translation circuit may during a first cycle convey the read address to the processor using the debug protocol, thereby causing the data at that address to be read (block 415). The processor may respond to receiving the read address during a second cycle by returning the requested data to the translation circuit according to the debug protocol (block 420). After receiving the data, the translation circuit may perform another protocol translation and transmit the data to the DAP via the fabric and in accordance with the fabric protocol.

Figure 5:
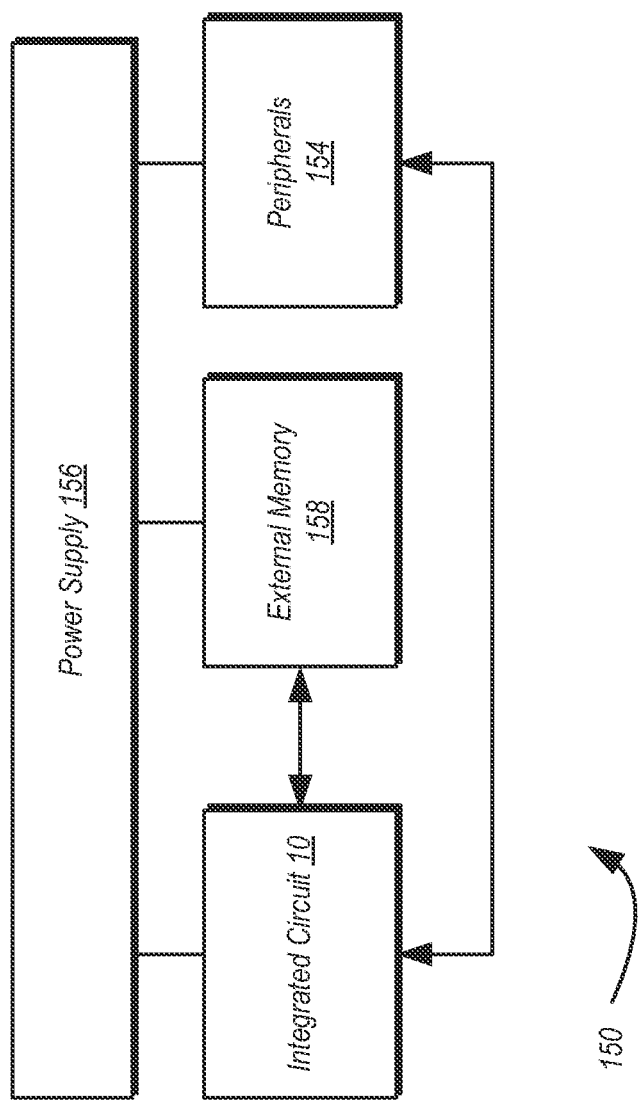
FIG. 5 is a block diagram of one embodiment of an exemplary system.

Turning next to FIG. 5, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a processor circuit;
a debug access port (DAP);
a communications fabric coupled between the processor circuit and the DAP, wherein the communications fabric implements a packet-switched network on a chip; and
a translation circuit coupled between the processor circuit and the communications fabric, wherein the translation circuit is configured to translate transactions to and from the processor circuit between a fabric protocol and a debug protocol, wherein the fabric protocol supports non-debug communications between the processor circuit and at least one other functional unit implemented on the integrated circuit during normal operation;
wherein the DAP includes translation circuitry configured to translate transactions between the fabric protocol and the debug protocol, and wherein the DAP is configured to convey transactions, in the fabric protocol, to the communication fabric.

2. The integrated circuit as recited in claim 1, wherein the translation circuit is configured to translate transactions from the DAP to the processor circuit from the fabric protocol to the debug protocol.

3. The integrated circuit as recited in claim 1, wherein the translation circuit is configured to translate transactions from the processor circuit to the DAP from the debug protocol to the fabric protocol.

4. The integrated circuit as recited in claim 1, wherein the translation circuit is configured to receive a write transaction from the DAP, transmit an address of a target of the write in a first cycle and transmit data to be written on a second cycle subsequent to the first.

5. The integrated circuit as recited in claim 1, wherein the translation circuit is configured to, responsive to detecting a read request from the DAP, send an address of a target of the read in a first cycle and receive data to be read on a second cycle.

6. The integrated circuit as recited in claim 5, further comprising the translation circuit conveying the data to the DAP according to the fabric protocol.

7. The integrated circuit as recited in claim 1, wherein the DAP is configured to communicate with a debugger external to the integrated circuit according to the debug protocol.

8. A method comprising:
conveying transactions to and from a processor circuit on a system fabric of an integrated circuit, the system fabric implementing a packet switched network on the integrated circuit, wherein said transactions are conveyed according to a system protocol, wherein the system protocol supports communications between the processor circuit and at least one other functional unit implemented on the integrate circuit during normal operation;

translating the transactions between the system protocol and a debug protocol using a translation circuit;

a debug access port (DAP) conveying transactions to the processor circuit on the system fabric according to the system protocol;

the DAP receiving transactions from the processor circuit, via the system fabric, according to the system protocol; and the DAP translating transactions between the system protocol and the debug protocol.

9. The method as recited in claim 8, further comprising:
the translation circuit translating the transactions to the processor circuit from the system protocol to the debug protocol.

10. The method as recited in claim 9, further comprising:
the translation circuit receiving a read transaction from the DAP via the system fabric and according to the system protocol;
the translation circuit conveying a read address, according to the debug protocol, to the processor circuit on a first cycle; and
the translation circuit receiving data from the processor circuit, according to the debug protocol, on a second cycle.

11. The method as recited in claim 10, further comprising the translation circuit conveying the data to the DAP according to the system protocol.

12. The method as recited in claim 9, further comprising the translation circuit receiving a write transaction via the DAP via the system fabric according to the system protocol.

13. The method as recited in claim 12, further comprising:
conveying, using the translation circuit, a write address to the processor circuit according to the debug protocol on a first cycle subsequent to receiving the write transaction; and
conveying to the processor circuit, on a second cycle subsequent to receiving the write transaction, data to be written to at the write address.

14. The method as recited in claim 8, further comprising:
the processor circuit conveying transactions to the translation circuit according to the debug protocol;
the translation circuit translating the transactions received from the processor circuit from the debug protocol to the system protocol and subsequently conveying the translated transactions to the DAP via the system fabric.

15. A system comprising:
a first processor circuit and a second processor circuit;
a debug access port (DAP), wherein the DAP is coupled to the first and second processor circuits by a communications fabric;
first and second translation units coupled to the first and second processor circuits, respectively, and further coupled to the communications fabric, wherein each of the first and second translation units is configured to translate communications between its respective processor circuit using a debug protocol and the communications fabric using a fabric protocol;

wherein the first processor circuit and second processor circuit are configured to communicate with one another using the fabric protocol during normal operation; and wherein the DAP includes translation circuitry configured to translate transactions between the fabric protocol and the debug protocol, and wherein the DAP is configured to convey transactions, in the fabric protocol, to the communications fabric.

16. The system as recited in claim 15, wherein the first and second translation circuits are configured to translate transactions conveyed from the DAP to their respectively coupled processor circuits from the fabric protocol to the debug protocol, and further configured to translate transactions conveyed from their respectively coupled processor circuits to the DAP from the debug protocol to the fabric protocol.

17. The system as recited in claim 15, wherein each of the first and second translation circuits is configured to, responsive to receiving a read transaction from the DAP according to the fabric protocol:
convey a read address, according to the debug protocol, to its respectively coupled one of the first and second processors during a first cycle;
receive data from the read address, according to the debug protocol, from its respectively coupled one of the first and second processors during a second cycle; and
convey data from its respectively coupled to one of the first and second processors to the DAP according to the fabric protocol.

18. The system as recited in claim 15, wherein each of the first and second translation circuits is configured to, responsive to receiving a write transaction from the DAP via the communications fabric according to the fabric protocol:
convey a write address, according to the debug protocol, to is respectively coupled one of the first and second processors during a first cycle; and
convey data to be written to the write address, according to the debug protocol, to its respectively coupled one of the first and second processor during a second cycle.

19. The system as recited in claim 15, further comprising:
a shared memory coupled to each of the first and second processor circuits; and
an arbitration unit configured to arbitrate access to the shared memory between the first and second processor circuits;
wherein the arbitration unit is configured to assign access priority to the first processor circuit and configured to grant requests for access to the shared memory by the second processor responsive to determining that there are no pending requests for access to the shared memory by the first processor.

20. The system as recited in claim 15, wherein the DAP is configured to communicate with a debugger external to the integrated circuit according to the debug protocol.

* * * * *